United States Patent
Kawasaki et al.

(10) Patent No.: US 6,333,876 B1
(45) Date of Patent: Dec. 25, 2001

(54) SEMICONDUCTOR MEMORY DEVICE

(75) Inventors: Toshiaki Kawasaki; Masashi Agata; Toshihiro Inokuchi, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/536,697

(22) Filed: Mar. 28, 2000

(30) Foreign Application Priority Data

Mar. 31, 1999 (JP) .................................................. 11-091493

(51) Int. Cl.[7] .................................................. G11C 7/00
(52) U.S. Cl. ..................................... 365/200; 365/230.03
(58) Field of Search .............................. 365/200, 230.03, 365/210, 225.7

(56) References Cited

U.S. PATENT DOCUMENTS

| | | | |
|---|---|---|---|
| 4,881,202 | 11/1989 | Tsujimoto et al. | 365/200 |
| 5,034,925 | 7/1991 | Kato | 365/200 |
| 5,231,604 | 7/1993 | Watanabe | 365/189.05 |
| 6,055,196 | * 4/2000 | Takai | 365/200 |
| 6,118,710 | * 9/2000 | Tsuji | 365/200 |

* cited by examiner

Primary Examiner—Amir Zarabian
(74) Attorney, Agent, or Firm—McDermott, Will & Emery

(57) ABSTRACT

The semiconductor memory device of the present invention has:
 a memory cell array including a plurality of memory cell groups and a redundant cell group having a plurality of redundant cells arranged in parallel with the memory cell groups;
 a cell selection circuit for allowing one of a plurality of cell selection lines to select a specific memory cell group;
 a defective cell designation section for outputting defective cell designation signals designating a predetected defective cell out of the plurality of memory cells;
 and a connection change circuit for electrically disconnecting the cell selection line
selecting the memory cell group including the defective cell from the cell selection circuit and outputting an output signal from the cell selection circuit to the redundant cell group. The defective cell designation section includes: a plurality of defective cell designation circuits for outputting designation signals capable of designating the plurality of cell selection lines; and a defective cell designation signal generation circuit for generating and outputting the defective cell designation signals based on the designation signals output from the plurality of defective cell designation circuits. The number of the plurality of defective cell designation circuits is smaller than the number of the plurality of cell selection lines.

10 Claims, 12 Drawing Sheets

Fig. 4(a)

| | FS(1) | FS(2) | FS(3) | FS(4) | FS(5) | FS(6) | FS(7) | FS(8) | FS(9) | FS(10) |
|---|---|---|---|---|---|---|---|---|---|---|
| ROM0 | 1 | 2 | 3 | – | – | – | – | – | – | – |
| ROM1 | – | – | – | 4 | 1 | 2 | 3 | 4 | – | – |
| ROM2 | – | – | – | – | – | – | – | – | 1 | 2 |

Fig. 4(b)

| WL | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| ROM0 | 1 | 2 | 3 | 4 | 1 | 2 | 3 | 4 | 1 | 2 | 3 | 4 | 1 | 2 | 3 | 4 |
| ROM1 | 1 | 1 | 1 | 1 | 2 | 2 | 2 | 2 | 3 | 3 | 3 | 3 | 4 | 4 | 4 | 4 |
| ROM2 | 1 | 1 | 1 | 1 | 1 | 1 | 1 | 1 | 1 | 1 | 1 | 1 | 1 | 1 | 1 | 1 |

| WL | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|
| ROM0 | 1 | 2 | 3 | 4 | 1 | 2 | 3 | 4 | 1 | 2 | 3 | 4 | 1 | 2 | 3 | 4 |
| ROM1 | 1 | 1 | 1 | 1 | 2 | 2 | 2 | 2 | 3 | 3 | 3 | 3 | 4 | 4 | 4 | 4 |
| ROM2 | 2 | 2 | 2 | 2 | 2 | 2 | 2 | 2 | 2 | 2 | 2 | 2 | 2 | 2 | 2 | 2 |

SEMICONDUCTOR MEMORY DEVICE

BACKGROUND OF THE INVENTION

The present invention relates to a semiconductor memory device providing redundant remedy for a defective cell by use of fuse elements or the like In general, in a semiconductor memory device having a plurality of memory cells arranged in an array on a semiconductor substrate made of silicon or the like, data read or write operation is performed in the following manner. A word line is selected by decoding an externally input row address signal, and a column line is selected by decoding an externally input column address signal. By the selected word line and column line, a memory cell is determined, and desired data is written on or read from the selected memory cell. The number of memory cells formed in an array is so enormous that a defective memory cell failing to operate normally may sometimes be included in the array of memory cells due to entering of a foreign substance in the fabrication process, generation of a defect in the substrate itself, or the like.

In consideration of the above situation, the design itself is made to provide redundant cells having the same function as the normal memory cells, together with a fuse circuit storing row address and column address information corresponding to a defective cell out of the plurality of memory cells. Once a defective cell is detected by probing or the like, a fuse element corresponding to the defective address is blown so as to replace the word line or column line corresponding to the defective cell with a spare (redundant) word line or column line. In this way, high yield is secured.

In a conventional dynamic redundancy circuit, determination on whether or not a redundancy circuit is used (redundancy determination) is necessary every active cycle. This lowers the operation speed. As one of circuitry techniques for solving this problem, provided is a shift redundancy circuit where a word line or column line corresponding to a defective cell is shifted to an adjacent word line or column line to effect redundant remedy.

Hereinbelow, a conventional semiconductor memory device having a shift redundancy circuit will be described with reference to FIG. 11.

FIG. 11 schematically shows a conventional semiconductor memory device having a shift redundancy circuit. The conventional semiconductor memory device includes a memory cell array 101 having a plurality of memory cells arranged in an array and n+1 word lines (n is a positive integer) running across the memory cell array. The semiconductor memory device also includes a row decoder 102 placed on one of the sides of the memory cell array 101 where terminals of the word lines WL are located. The row decoder 102 decodes m row address signals AX (m is a positive integer) input thereto externally so as to select one of the n word lines.

The word line WL(n+1) is a spare (redundant) word line connected with a redundant cell section 101a in the memory cell array 101.

A selector circuit 104 is placed between the memory cell array 101 and the row decoder 102. The selector circuit 104 receives n output signals from the row decoder 102 and n defective cell designation signals SEL from a fuse circuit 103, and switches the connection between output lines of the row decoder 102 and the word lines WL based on the defective cell designation signals SEL.

FIG. 12 shows the fuse circuit 103 and the selector circuit 104 in detail. As shown in FIG. 12, the fuse circuit 103 has a serial configuration of n serially connected fuse elements FS (FS(1) to FS(n)) that respectively correspond to the n decode output signals PX(1) to PX(n) output from the row decoder 102 shown in FIG. 11. The terminal external of the first fuse element FS(1) in the serial configuration is connected with the power supply, and the terminal external of the n-th fuse element FS(n) in the serial configuration is grounded via a resistor R having a sufficiently large resistance value.

The selector circuit 104 includes n first switch circuits 104a and n second switch circuits 104c. The first switch circuits 104a open/close the connection between the output signals PX(n; n=1 to n) from the row decoder 102 and the corresponding word lines WL(n; n=1 to n) based on the defective cell designation signals SEL(n; n=1 to n). The second switch circuits 104c open/close the connection between the output signals PX(n; n=1 to n) from the row decoder 102 and the word lines WL(n+1; n=1 to n) adjacent to the corresponding word lines WL based on a signal inverted from the defective cell designation signal SEL(n; n=1 to n) by respective inverters 104b.

The first switch circuits 104a and the second switch circuits 104c in n pairs have the same circuit configuration. For example, if the first switch circuit 104a is turned ON when the defective cell designation signal SEL is in the HIGH level, the second switch circuit 104a that receives the LOW-level defective cell designation signal SEL is turned OFF. This enables the output signal PX(n) from the row decoder 102 to be selectively output to either one of the adjacent word lines WL(n) and WL(n+1).

Hereinbelow, how to use and operate the fuse circuit 103 and the selector circuit 104 with the above configuration will be described.

For example, assume that no defective cell has been detected in the memory cell array 101 shown in FIG. 11. In this case, no fuse element FS in the fuse circuit 103 is blown. Therefore, the potentials at all nodes SEL(n; n=1 to n) between the adjacent fuse elements FS are HIGH due to the high-resistance resistor-R. The potentials at the nodes SEL (n; n=1 to n) are input into the selector circuit 104 as the defective cell designation signals SEL(n; n=1 to n). This turns ON all the first switch circuits 104a so that the decode output signals PX(n; n=1 to n) are output to the corresponding word lines WL(n; n=1 to n).

Next, assume that any of the memory cells connected to the third word line WL(3) has been found defective. In this case, the third fuse element FS(3) is blown. Therefore, while the first defective cell designation signal SEL(1) and the second defective cell designation signal SEL(2) are kept in the HIGH level, the third to n-th defective cell designation signals SEL(3) to SEL(n) are turned to the LOW level. As a result, in the third circuit pair of the selector circuit 104 receiving the third output signal PX(3), while the first switch circuit 104a is turned OFF, the second switch circuit 104c is turned ON. This allows the third output signal PX(3) from the row decoder 102 to be output to the fourth word line WL(4). Likewise, the fourth to n-th output signals PX(4) to PX(n) from the row decoder 102 are output to the word lines WL downstream adjacent to the corresponding word lines WL. In other words, the word lines WL to which the output signals are output are shifted to those having a one-incremented numerical subscript.

In short, when a defective cell connected with the third word line WL(3) is to be remedied, the fuse element FS(3) corresponding to the third word line WL(3) is blown so that the connection between the third output signal PX(3) from the row decoder 102 and the third word line WL(3) is cut off. The connection of the third output signal PX(3) and the subsequent output signals with the word lines WL is then shifted by one in the order of the placement of the word lines WL. This remedy of a defective cell ensures high yield.

In addition, the defective cell designation signals SEL for determining the connection between the output signals PX from the row decoder 102 and the word lines WL are DC voltages that are determined right after powering based on the blown states of the fuse elements PS. This eliminates the necessity of performing the redundancy determination every active cycle as is required for the dynamic redundancy circuit, thereby realizing high-speed operation.

However, the above conventional semiconductor memory device has the following problems. The shift redundancy circuit includes the fuse circuit 103 of the serial configuration composed of n fuse elements FS(n). If the number of word lines WL(n) extending across the memory cell array 101 is doubled to 2n, the number of fuse elements FS needs to be 2n. The signal line carrying the signal SEL(n) input into the selector circuit 104 from the fuse circuit 103 also needs to be 2n. This greatly increases the layout area required on the substrate.

In view of the above prior art problem, an object of the present invention is to provide a semiconductor memory device employing the shift redundancy circuit scheme where the area occupied by the redundancy circuit is comparatively small with respect to the entire area of the device.

SUMMARY OF THE INVENTION

In order to attain the above object, the present invention is directed to encoding (multiplying) a defective cell designation signal output from a defective cell designation section as the fuse circuit.

More concretely, the semiconductor memory device of the present invention that is formed on a semiconductor substrate includes: a memory cell array including a plurality of memory cell groups arranged in a plurality of rows or columns, each of the memory cell groups having a plurality of memory cells lined in a row or column, and a redundant cell group having a plurality of redundant cells arranged in parallel with the memory cell groups; a plurality of cell selection lines for selecting a specific memory cell group out of the plurality of memory cell groups; a cell selection circuit for allowing one cell selection line out of the plurality of cell selection lines to select the specific memory cell group based on an external signal; defective cell designation means for outputting a defective cell designation signal designating a pre-detected defective cell out of the plurality of memory cells; and connection change means for electrically disconnecting the cell selection line selecting the memory cell group including the defective cell from the cell selection circuit and outputting an output signal from the cell selection circuit to the redundant cell group. The defective cell designation means includes: a plurality of defective cell designation circuits for outputting designation signals capable of designating the plurality of cell selection lines; and a defective cell designation signal generation circuit for generating and outputting the defective cell designation signals based on the designation signals output from the plurality of defective cell designation circuits. The number of the plurality of defective cell designation circuits is smaller than the number of the plurality of cell selection lines.

According to the semiconductor memory device of the present invention, if a design change is attempted to increase the number of cell selection lines, the change is not so influential on the layout area and thus will not impede size reduction of the device, unlike the conventional fuse elements where the defective cell designating elements or circuits correspond to the cell selection lines in a one-to-one relationship.

Preferably, the semiconductor memory device of the present invention further includes a redundant cell selection line provided for the redundant cell group. The plurality of defective cell designation circuits output encoded signals as the designation signals. The defective cell designation signal generation circuit includes: a decode circuit for receiving the encoded signals, decoding the encoded signals to a plurality of decoded signals respectively corresponding to the plurality of cell selection lines, and outputting the plurality of decoded signals; and a connection change control circuit for receiving the plurality of decoded signals, generating the defective cell designation signals for allowing the plurality of cell selection lines excluding the cell selection line selecting the memory cell group including the defective cell and the redundant cell selection line to correspond with the output signals from the cell selection circuit, and outputting the defective cell designation signals.

With the above configuration, the plurality of defective cell designation circuits output encoded signals as the designation signals. If the encoded signals are binary signals, eight cell selection lines can be selected by use of three selection signals. It is therefore possible to make the number of the defective cell designation circuits smaller than that of the cell selection lines.

In the semiconductor memory device of the present invention, preferably, the redundant cells and the redundant cell selection line are placed on a side end of the memory cell array. The connection change means receives the defective cell designation signals and outputs the output signals from the cell selection circuit to the cell selection lines by sequentially shifting by one line from the cell selection line selecting the memory cell group including the defective cell downstream toward the redundant cell selection line. This allows the connection change means to be configured as the shift redundancy circuit.

In the above case, the connection change means preferably includes: a ground circuit that turns the potential of the redundant cell selection line to the ground potential when no defective cell is detected in the plurality of memory cells or, when a defective cell has been detected, turns the potential of the cell selection line selecting the memory cell group including the defective cell to the ground potential. This prevents the potential from becoming unstable at the redundant cell selection line or a cell selection line that is not connected with the selection circuit, and thus prevents malfunction of the circuit.

In the semiconductor memory device of the present invention, each of the plurality of defective cell designation circuits preferably includes: a power supply cut-off element capable of cutting off supply of the power supply voltage that drives the defective cell designation circuit; and a signal latch circuit connected to the power supply cut-off element for latching and outputting a signal with the same phase as an input signal. Thus, the power supply cut-off elements that supply respective driving voltages to the plurality of the signal latch circuits are properly cut off. This permits a complementary relationship to be established between the output value from some of the latch circuits that have been cut off from the power supply voltage and the output value from the remaining latch circuits that have not been cut off from the power supply voltage. Using these output values having the complementary relationship, the encoded signals can be reliably generated.

In the above case, the power supply cut-off element is preferably a fuse element. Using the fuse element benefits the following. If a signal input upon powering (reset signal) is used as the input signal to the defective cell designation circuits, the resultant defective cell designation signals are DC voltages that are determined upon powering based on the blowing states of the fuse elements. This eliminates the necessity of performing the redundancy determination every active cycle as in the dynamic redundancy circuit, and thus realizes high-speed operation.

In the semiconductor memory device of the present invention, preferably, the connection change control circuit includes a plurality of unit circuits that receive the plurality of decoded signals, and the unit circuits are connected with each other so that an output signal from each of the unit circuits also serves as one input signal to the adjacent unit circuit downstream toward the signal line corresponding to the redundant cell selection line. With this configuration, an output signal from each of the plurality of unit circuits is branched to be supplied to one input terminal of the adjacent unit circuit downstream toward the signal line corresponding to the redundant cell selection line. Therefore, when the level of the decoded signal input into one of the plurality of unit circuits is inverted, the inversion information is input into the adjacent unit circuit downstream toward the redundant cell selection line. As a result, the defective cell designation signals can be generated so as to correspond to the shift redundancy circuit.

BRIEF DESCRIPTION OF THE DRAWINGS

FIG. 4(a) is a table for storing fuse element information for use in the fuse circuit in the embodiment of the present invention.

FIG. 4(b) is a table for storing fuse element—word line correspondence information for use in the fuse circuit in the embodiment of the present invention.

DESCRIPTION OF THE PREFERRED EMBODIMENTS

Hereinafter, a preferred embodiment of the present invention will be described with reference to the accompanying drawings.

Figure 1:
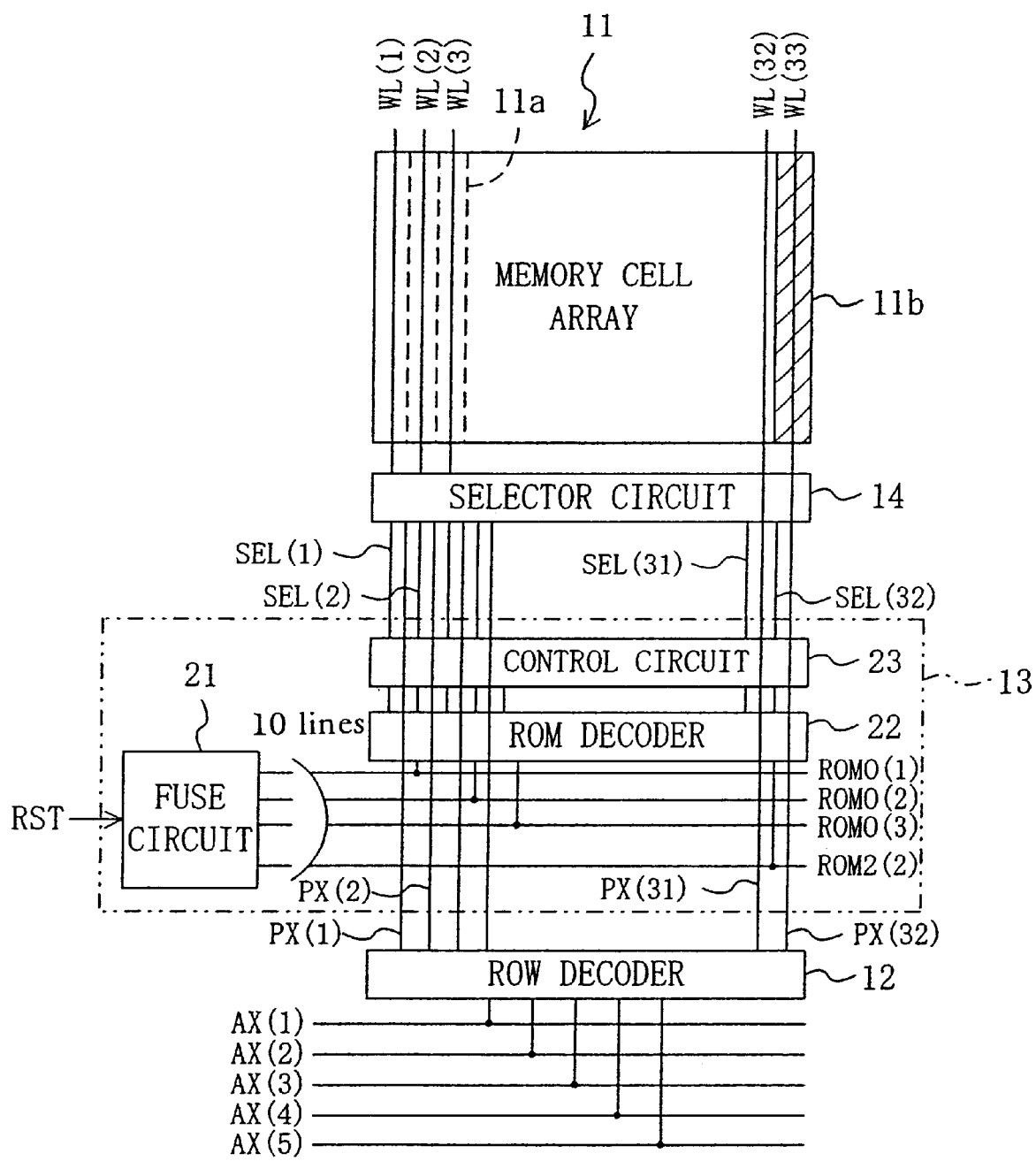
FIG. 1 is a schematic diagram of the construction of a semiconductor memory device provided with a shift redundancy circuit of an embodiment of the present invention.

FIG. 1 illustrates a schematic construction of the semiconductor memory device provided with a shift redundancy circuit of an embodiment of the present invention. Referring to FIG. 1, the semiconductor memory device of this embodiment includes a memory cell array 11 formed on a substrate made of silicon, for example. The memory cell array 11 includes: a plurality of memory cell groups 11a arranged in a plurality of columns or rows, each having a plurality of memory cells lined in a column or row; and a redundant cell group 11b having a plurality of redundant cells arranged in parallel with the memory cell groups 11a.

As an example, assume in this embodiment that the memory cell array 11 includes 32 rows of memory cell groups 11a, one row of redundant cell group 11b, 32 word lines WL(1) to WL(32) as the cell selection lines for selecting the respective memory cell groups 11a, and a spare word line WL(33) as the redundant cell selection line for selecting the redundant cell group 11b.

A row decoder 12 as the cell selection circuit is placed on one of the sides of the memory cell array 11 where the terminals of the word lines WL are located. The row decoder 12 decodes five row address signals AX(1) to AX(5) input externally and outputs 32 decode signals PX(1) to PX(32), so as to select one out of the 32 word lines WL.

A selector circuit 14 as the connection change means is placed between the memory cell array 11 and the row decoder 12. The selector circuit 14 receives the 32 decode signals PX(1) to PX(32) from the row decoder 12 and 32 defective cell designation signals SEL(L) to SEL(32) from a defective cell designation section 13 to be described below, and switches the connection between the word lines WL and signal lines carrying the decode signals PX based on the respective defective cell designation signals SEL.

The defective cell designation section 13 includes: a fuse circuit 21 essentially composed of a plurality of defective cell designation circuits; a ROM decoder 22 as the decode circuit; and a control circuit 23 as the connection change control circuit.

The fuse circuit 21 receives a reset signal RST and outputs ten encoded designation signals preset as the internal states for the respective defective cell designation circuits. These ten encoded designation signals allow any one of the word lines WL(1) to WL(32) to be designated.

The ROM decoder 22 receives the encoded designation signals from the fuse circuit 21 and decodes the input designation signals into 32 signals, that is, the same number of signals as that of the word lines WL.

The control circuit 23 receives the decoded signals and generates the defective cell designation signals SEL(1) to SEL(32) for enabling the decode signals PX(1) to PX(32) to correspond with the word lines WL(1) to WL(32) and the spare word line WL(33).

Figure 2:
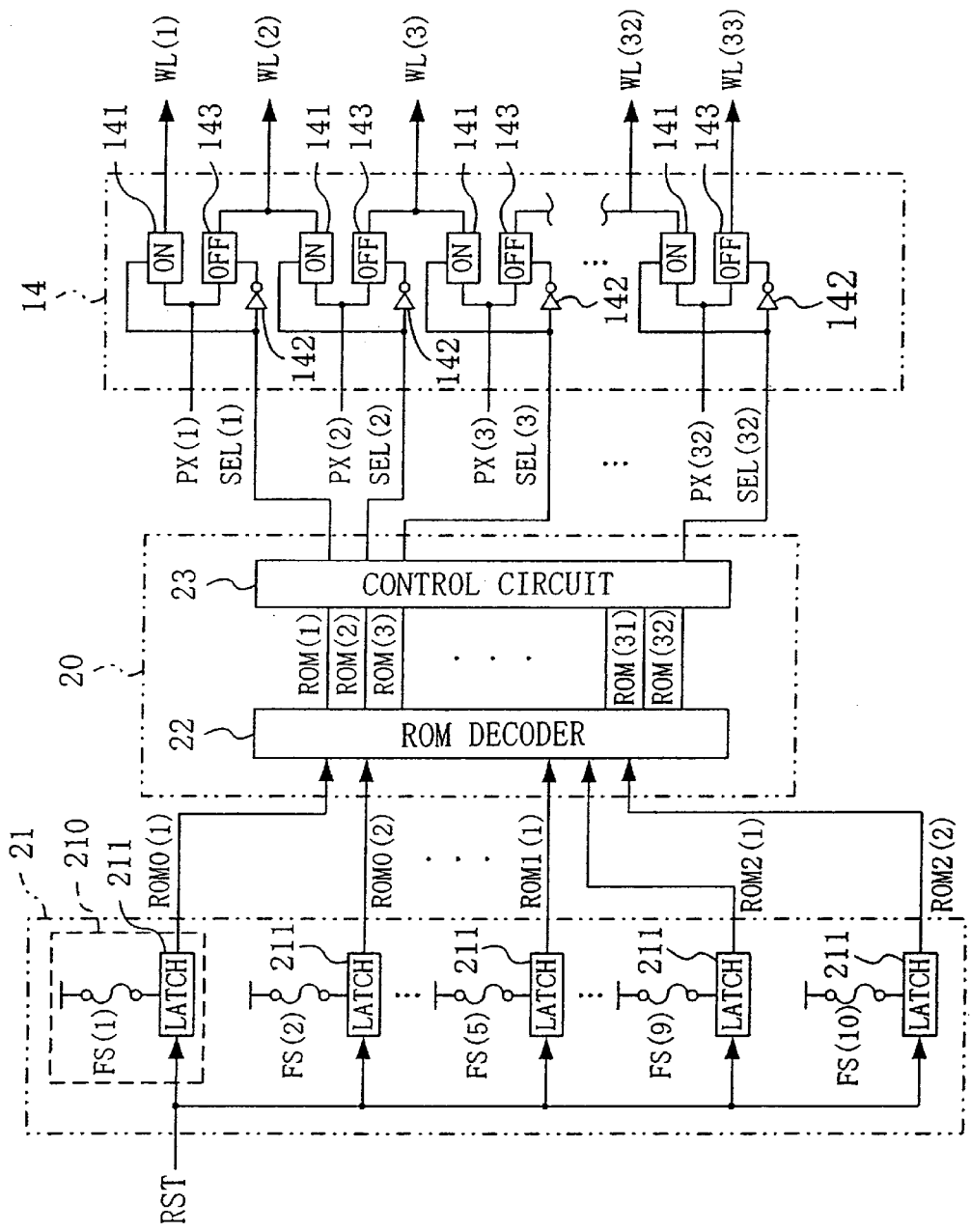
FIG. 2 is a block diagram of a fuse circuit, a connection change control circuit, and a selector circuit in the shift redundancy circuit for the semiconductor memory device of the embodiment of the present invention.

FIG. 2 is a block diagram of the fuse circuit 21, a connection change control circuit 20 composed of the ROM decoder 22 and the control circuit 23, and the selector circuit 14. As shown in FIG. 2, the fuse circuit 21 includes ten independent defective cell designation circuits 210. Each defective cell designation circuit 210 is essentially composed of a fuse element FS as the power supply cut-off element and a latch circuit 211 for receiving a power supply voltage for circuit driving via the fuse element FS.

The ROM decoder 22 decodes the designation signals received from the fuse circuit 21, to output decoded signals ROM(1) to ROM(32).

Figure 12:
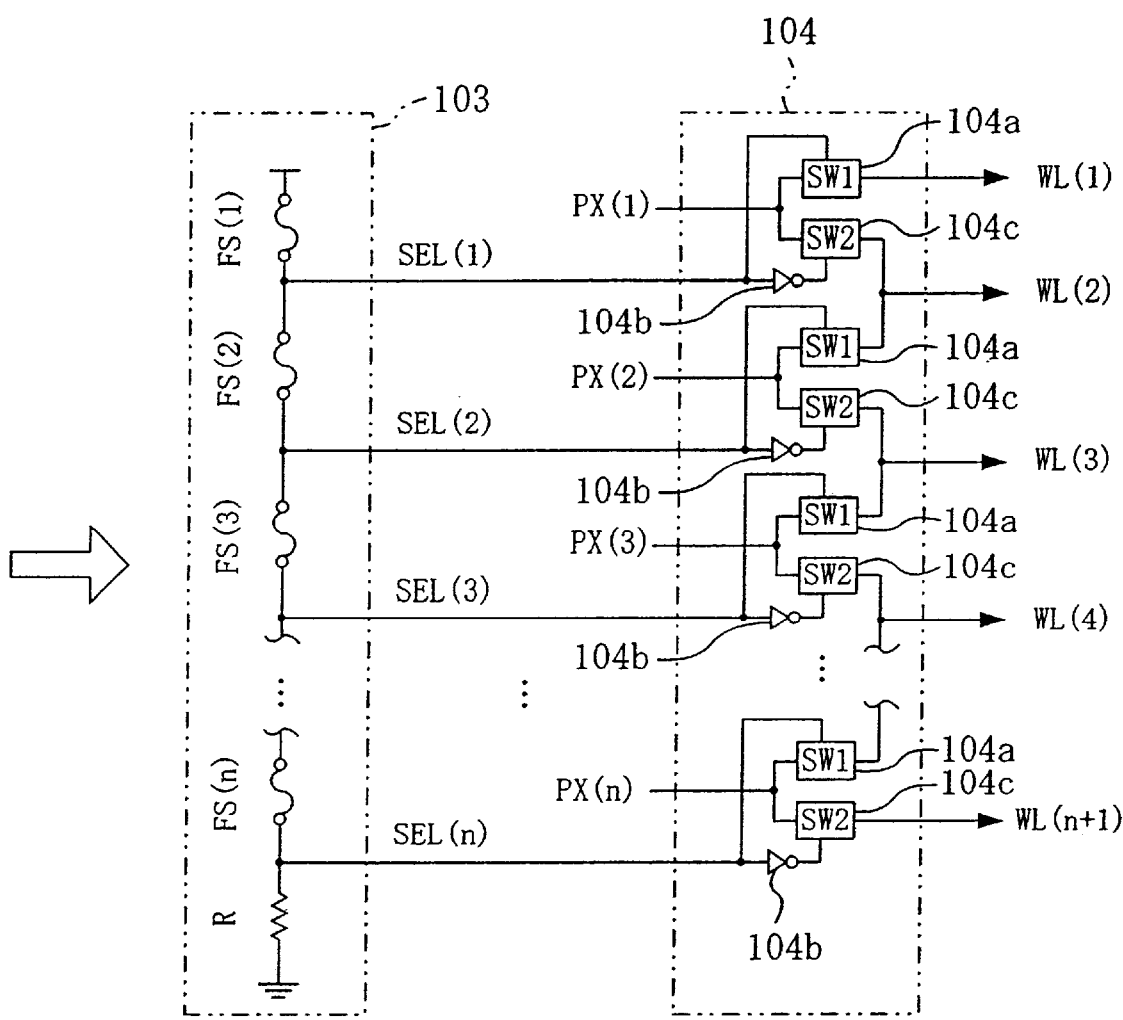
FIG. 12 is a circuit diagram of the conventional shift redundancy circuit.

The selector circuit 14 receives the decode signals PX(1) to PX(32) from the row decoder 12 and the defective cell designation signals SEL(1) to SEL(32) from the control circuit 23. The input decode signals PX(1) to PX(32) are output to the word lines WL(1) to WL(32) or the spare word line WL(33) based on the respective defective cell designation signals SEL(1) to SEL(32). The selector circuit 14 includes 32 switch pairs each substantially composed of a first switch circuit 141 and a second switch circuit 143. For example, the first switch circuit 141 of the first switch pair receives the first decode signal PX(1) and the defective cell designation signal SEL(1), and the second switch circuit 143 of the first switch pair receives the first decode signal PX(1) and the inverted signal of the defective cell designation signal SEL(1) via an inverter 142. The selector circuit 14 in this embodiment therefore has the same configuration as the selector circuit 104 shown in FIG. 12.

Figure 3:
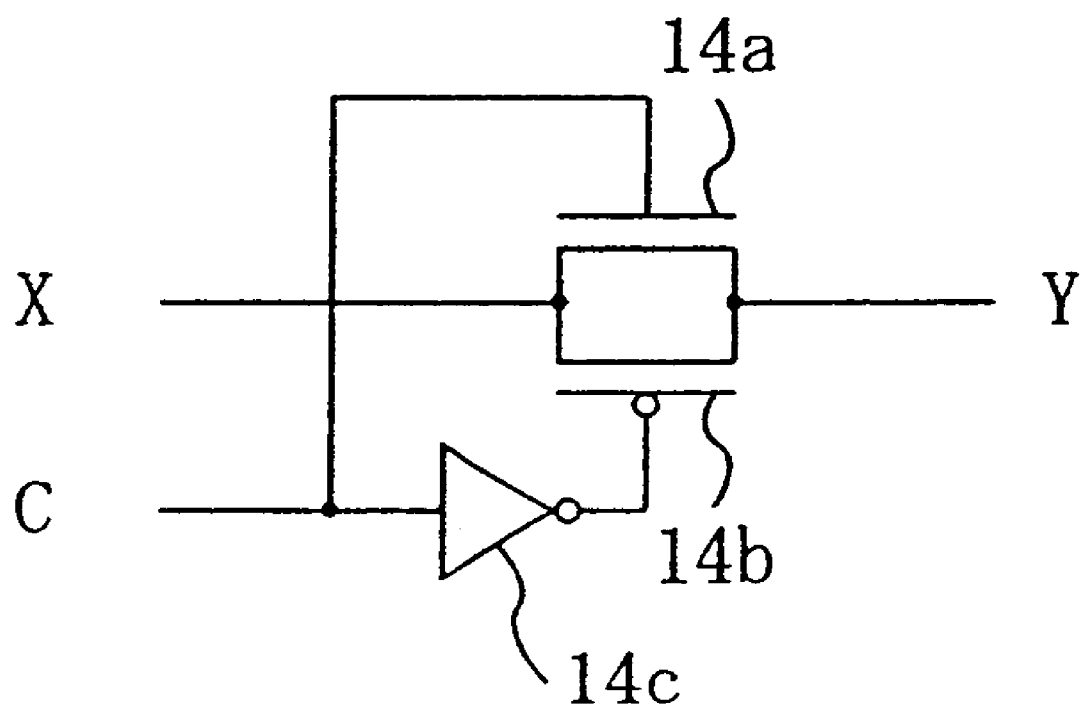
FIG. 3 is a circuit diagram of a switch circuit of the selector circuit in the shift redundancy circuit in the embodiment of the present invention.

FIG. 3 shows an example of the circuit configuration of the first switch circuit 141. Referring to FIG. 3, the first switch circuit 141 includes an NMOS transistor 14a and a PMOS transistor 14b connected in parallel between an input terminal X and an output terminal Y. A control signal C is applied to the gate of the NMOS transistor 14a, while it is inverted by an inverter 14c before being applied to the gate of the PMOS transistor 14b. In the case of the selector circuit 14 shown in FIG. 2, the decode signal PX is input at the input terminal X, and the word line WL is connected to the output terminal Y. The control signal C is the defective cell designation signal SEL. The second switch circuit 143 may also have the configuration shown in FIG. 3, although, in this case, the inverted signal of the defective cell designation signal SEL is applied as the control signal C.

Hereinafter, concrete encoding processing by the fuse circuit 21 will be described.

FIGS. 4(a) and 4(b) are an example of the encoding combinations of encoded designation signals ROM0, ROM1, and ROM2 output by the fuse circuit 21 in this embodiment.

FIG. 4(a) shows a fuse element information table for storing the order of the fuse elements FS as a parameter. As shown in FIG. 4(a), a ROM capable of storing at least 5-bit information is prepared for storing fuse element correspondence information. The two least significant bits of the 5-bit data are used to correspond to the first to fourth fuse elements FS(1) to FS(4) as first correspondence information ROM0. The two more significant bits are used to correspond to the fifth to eighth fuse elements FS(5) to FS(8) as second correspondence information ROM1. The most significant bit is used to correspond to the ninth to tenth fuse elements PS(9) and FS(10) as third correspondence information ROM2.

FIG. 4(b) shows a table for storing the correspondence information between the word lines WL and the fuse elements FS with the first to third correspondence information ROM0 to ROM2 as parameters. In this table, for example, the case where all the values of the first to third correspondence information ROM0 to ROM2 are 1 corresponds to the first word line WL(1) (hereinafter, the correspondence information ROM0 to ROM2 is represented such that the first correspondence information having a value of 1 is "ROM0 (1)", for example).

In the above case, therefore, referring to the fuse element information table shown in FIG. 4(a), the first word line WL(1) can be selected by the three fuse elements, that is, the first fuse element FS(1), the fifth fuse element FS(5), and the ninth fuse element FS(9).

With the encoding made for the fuse elements FS(1) to FS(10) as described above, the designation signal ROM0(1) is output from the first latch circuit 211, the designation signal ROM0(2) is output from the second latch circuit 211, and the designation signal ROM2(2) is output from the tenth latch circuit 211, for example, as shown in FIG. 2.

The tables shown in FIGS. 4(a) and 4(b) are a mere example of encoding information. Only required is that the encoding information must be defined so that all the word lines WL can be selected by use of the number of fuse elements FS smaller than the total number of the word lines WL.

Figure 5:
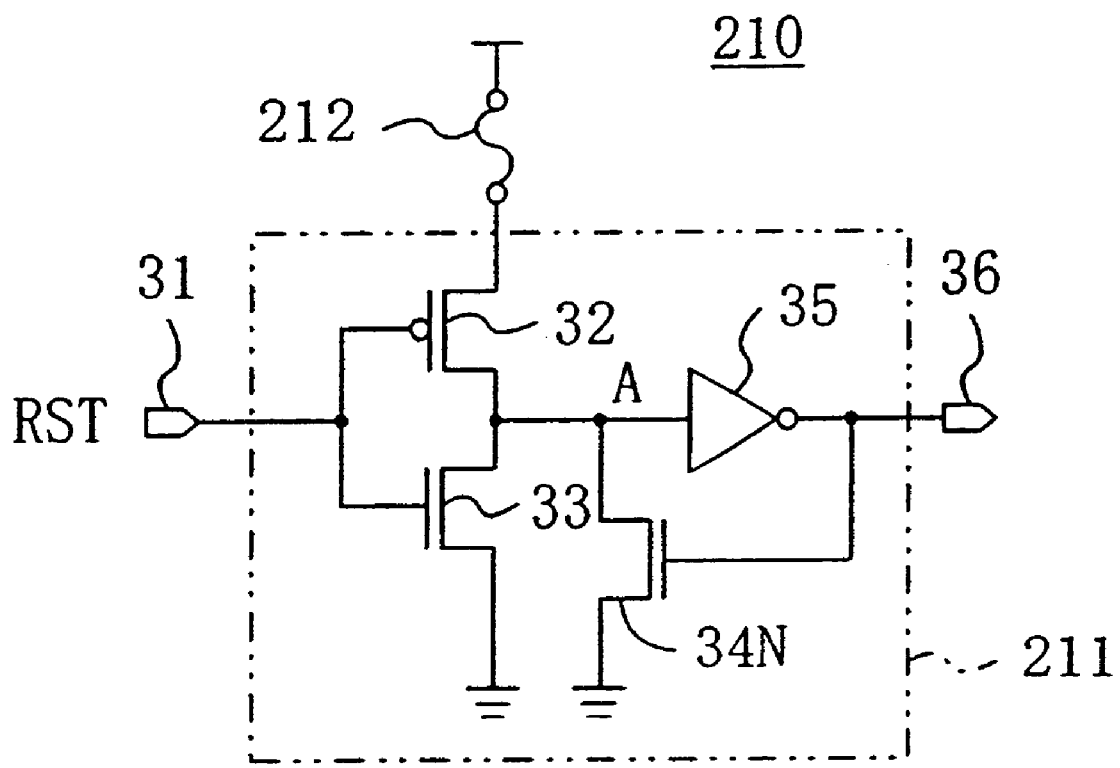
FIG. 5 is a circuit diagram of an example of a defective cell designation circuit constituting the fuse circuit in the embodiment of the present invention.

FIG. 5 shows a detailed circuit configuration of the defective cell designation circuit 210. Referring to FIG. 5, the latch circuit 211 of the defective cell designation circuit 210 includes a PMOS transistor 32 and an NMOS transistor 33 sharing the gate and the drain. The common gate is connected to an input terminal 31. The source of the PMOS transistor 32 is connected to the power supply via a fuse element 212, and the source of the NMOS transistor 33 is grounded. To the common drain, an NMOS latch transistor 34N is connected in parallel. The source of the NMOS latch transistor 34N is grounded. An inverter 35 is also connected to the common drain. The output signal of the inverter 35 is supplied to an output terminal 36, as well as to the gate of the NMOS latch transistor 34N.

The operation of the defective cell designation circuit 210 with the above configuration will be described.

During the first period when the reset signal RST is in the HIGH level, the PMOS transistor 32 is in the OFF state and the NMOS transistor 33 is in the ON state, so that the potential at the common drain (node A) is the ground (LOW) potential. The inverter 35 receives the LOW potential and outputs a HIGH potential, thereby turning the potential at the output terminal 36 HIGH. The NMOS latch transistor 34N is turned ON on receipt of the HIGH potential. As a result, the node A is latched at the LOW potential and thus the output potential is held HIGH.

During the second period when the reset signal RST is in the LOW level, either of the following two different procedures follows depending on the conduction state of the fuse element 212.

In the case where the fuse element 212 is not blown but kept conducting, the PMOS transistor 32 is in the ON state and the NMOS transistor 33 is in the OFF state, so that a charge is supplied to the node A from the power supply via the fuse element 212 and the PMOS transistor 32. This makes the potential at the node A higher than the switching level of the inverter 35, thereby turning the potential at the output terminal 36 LOW.

In the case where the fuse element 212 has been blown and made non-conducting, although the PMOS transistor 32 is in the ON state, no charge is supplied to the node A. The potential at the output terminal 36 is therefore held HIGH.

Thus, when the reset signal RST transitions from HIGH to LOW, the defective cell designation circuit 210 changes the output potential from HIGH to LOW in response to the transition of the reset signal RST if the fuse element 212 is not blown. If the fuse element 212 has been blown, the defective cell designation circuit 210 continues outputting the HIGH potential.

Figure 6:
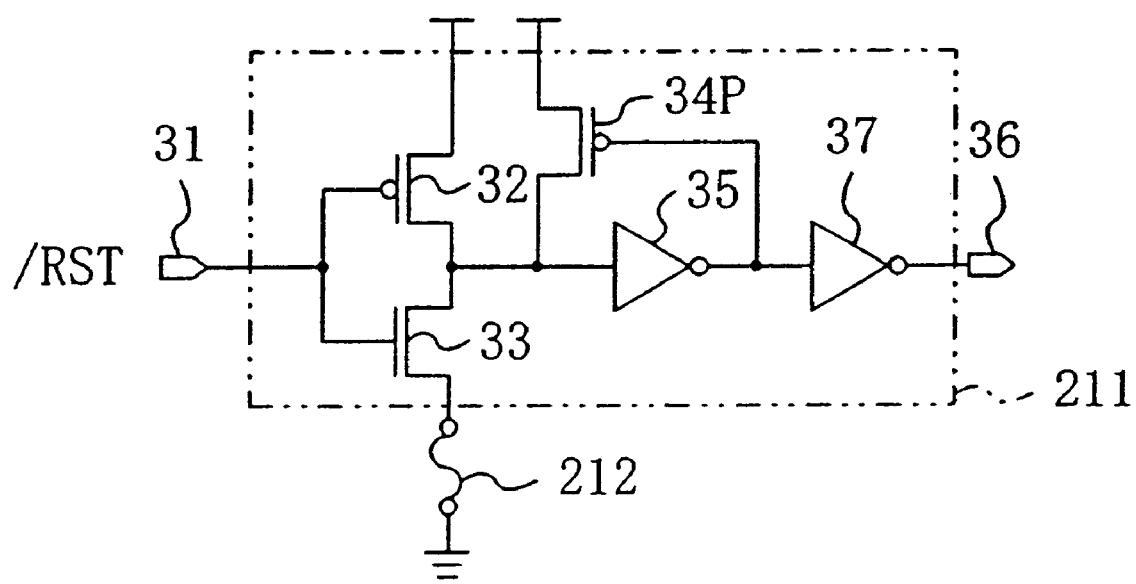
FIG. 6 is a circuit diagram of another example of the defective cell designation circuit constituting the fuse circuit in the embodiment of the present invention.

FIG. 6 shows another circuit configuration of the defective cell designation circuit 210 where an inverted signal /RST of the reset signal RST is input. In this case, the fuse element 212 is connected between the source of the NMOS transistor 33 and the ground, a PMOS latch transistor 34P is used in place of the NMOS latch transistor 34N, and an additional inverter 37 is provided between the inverter 35 and the output terminal 36. With this configuration, substantially the same operation as that of the defective cell designation circuit 210 shown in FIG. 5 is ensured.

Next, the ROM decoder 22 as the decode circuit and the control circuit 23 as the connection change control circuit shown in FIG. 2 will be described in detail.

Figure 7:
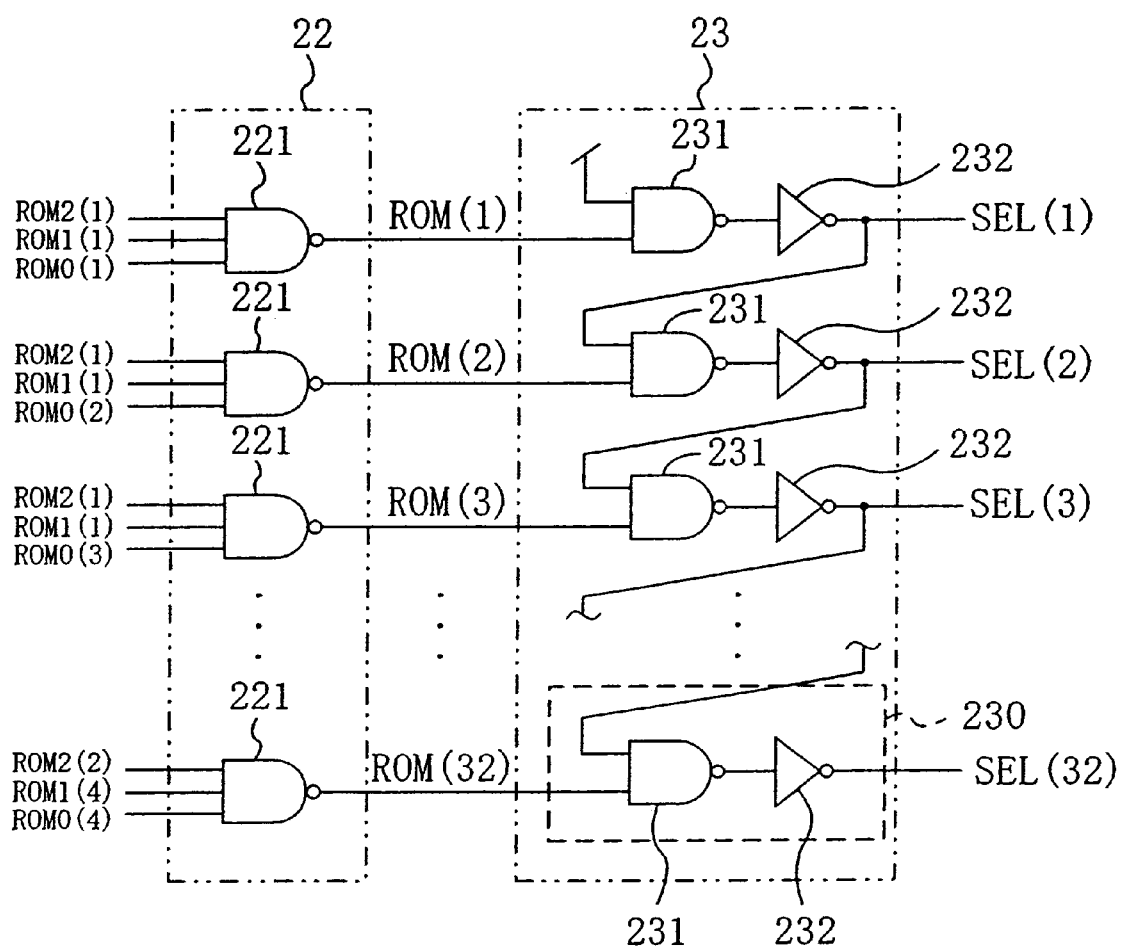
FIG. 7 is a circuit diagram of a ROM decoder and a control circuit of the connection change control circuit in the embodiment of the present invention.

FIG. 7 shows an example of the circuit configuration of the ROM decoder 22 and the control circuit 23 in this embodiment. Referring to FIG. 7, the ROM decoder 22 includes 32 3-input NAND circuits 221. In each 3-input NAND circuit 221, the first input terminal located at the lower position as is viewed from the figure receives one of the designation signals ROM0(1) to ROM0(4) as the first correspondence information, the second input terminal at the middle position receives one of the designation signals ROM1(1) to ROM1(4) as the second correspondence information, and the third input terminal at the upper position receives the designation signal ROM2(1) or ROM2(2) as the third correspondence information. The 32 3-input NAND circuits 221 with the above configuration respectively output the decoded signals ROM(n; n=1 to 32). For example, the first 3-input NAND circuit 221 located at the uppermost position as is viewed from the figure receives ROM0(1) at the first input terminal, ROM1(1) at the second input terminal, and ROM2(1) at the third input terminal, and outputs the decoded signal ROM(1) that corresponds to the first word line WL(1).

The control circuit 23 includes 32 unit circuits 230. Each unit circuit 230 includes a 2-input NAND circuit 231 and an inverter 232 connected in series. One of the input terminals of the 2-input NAND circuit 231 receives one of the decoded signals ROM(1) to ROM(32) from the ROM decoder 22, and the other input terminal receives the output signal from the upstream adjacent unit circuit 230 having a smaller-number subscript to effect feedforward connection. Note that the other input terminal of the 2-input NAND circuit 231 of the first unit circuit 230 is connected to the power supply.

Hereinafter, the operation of the defective cell designation section 13 as the shift redundancy circuit with the above configuration will be described with reference to the relevant drawings.

(Case where no defective cell exists)

In the case where no defective cell is detected in the memory cell array 11 shown in FIG. 1, none of the fuse elements FS(1) to FS(10) of the fuse circuit 21 needs to be blown. Accordingly, when the reset signal RST input internally or externally upon powering is in the HIGH level, all the encoded designation signals ROM0, ROM1, and ROM2 are in the HIGH level. Once the reset signal RST transitions to the LOW level, all the encoded designation signals ROM0, ROM1, and ROM2 are turned to the LOW level.

The LOW-level designation signals ROM0 to ROM2 are then input into the input terminals of the 3-input NAND circuits 221 of the ROM decoder 22 shown in FIG. 7. Therefore, all the decoded signals ROM(1) to ROM(32) output from the 3-input NAND circuits 221 are in the HIGH level.

The HIGH-level decoded signals ROM(1) to ROM(32) are then input into the unit circuits 230 of the control circuit 23 shown in FIG. 7. Since the feedforward input potentials are also HIGH, the resultant defective cell designation signals SEL(1) to SEL(32) output from the respective unit circuits 230 are all in the HIGH level.

Subsequently, in the selector circuit 14 shown in FIG. 2, since all the defective cell designation signals SEL(1) to SEL(32) are in the HIGH level, all the first switch circuits 141 are in the ON state while all the second switch circuits 143 are in OFF state. This allows the decode signals PX(1) to PX(32) supplied from the row decoder 12 to be output to the corresponding word lines WL(1) to WL(32).

(Case where a defective cell exists)

Hereinbelow, as an example, the case where any of the plurality of memory cells to be selected by the tenth word line WL(10) is detected defective will be described.

First, the fuse elements FS corresponding to the tenth word line WL(10) are specified by referring to the table for storing the correspondence information between the fuse elements FS and the word lines WL shown in FIG. 4(b). It is found from the table that the combination of the designation signals ROM0 to ROM2 designating the tenth word line WL(10) is ROM0(2), ROM1(3), and ROM2(1). Subsequently, the fuse element information table shown in FIG. 4(a) is referred to, to find that the corresponding combination of the fuse elements FS is the second fuse element FS(2), the seventh fuse element FS(7), and the ninth fuse element FS(9). In this way, it is found that the tenth word line WL(10) can be designated by blowing the three fuse elements FS(2), FS(7), and FS(9).

Figure 8:
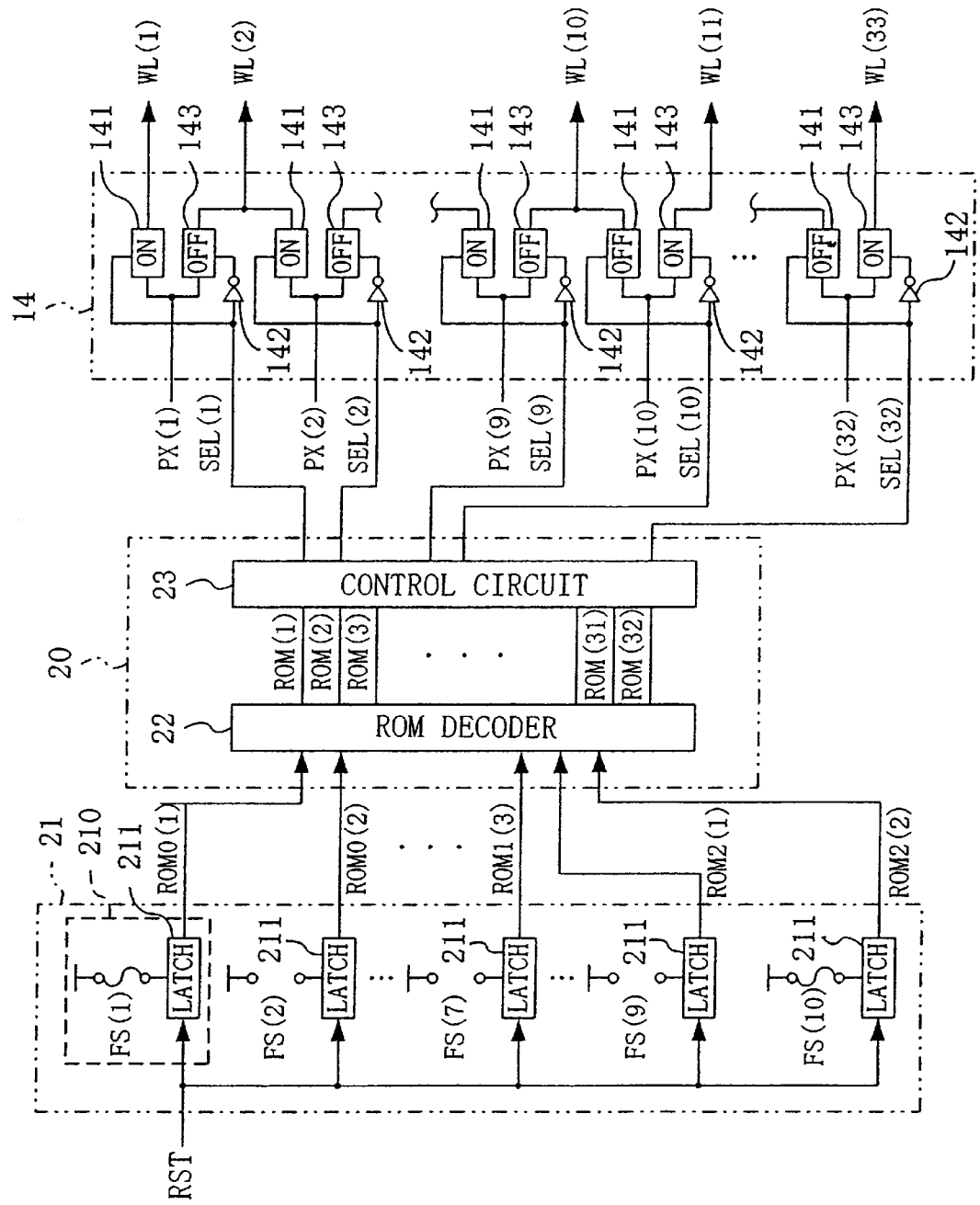
FIG. 8 is a block diagram of the shift redundancy circuit for the semiconductor memory device of the embodiment of the present invention, showing the states of the fuse circuit, the connection change control circuit, and the selector circuit when a defective cell has been detected.

FIG. 8 shows the state of the circuit observed when the three fuse elements FS(2), FS(7), and FS(9) have been blown in the fuse circuit 21 shown in FIG. 2. In FIG. 8, the same components as those shown in FIG. 2 are denoted by the same reference numerals. In the defective cell designation circuit 210 of the fuse circuit 21 shown in FIG. 8, as described above with reference to FIG. 5, once the fuse element 212 is blown, the output is held in the HIGH level even during the second period when the reset signal RST is in the LOW level. Therefore, in the ROM decoder 22 shown in FIG. 7, all the designation signals ROM0(2), ROM1(3), and ROM2(1) that are the input signals to the tenth 3-input NAND circuit 221 are in the HIGH level. The tenth 3-input NAND circuit 221 therefore outputs a LOW-level signal.

In the control circuit 23, the defective cell designation signal SEL(10) output from the tenth unit circuit 230 is turned to the LOW level. The output signal of the tenth unit circuit 230 is also supplied to the downstream adjacent eleventh unit circuit 230, causing the eleventh unit circuit 230 also to output a LOW-level signal. In this way, all the remaining downstream unit circuits 230 output LOW-level signals.

In the selector circuit 14 shown in FIG. 8, out of the input decode signals PX(1) to PX(32), the first to ninth decode signals PX(1) to PX(9) are output to the corresponding word lines WL(1) to WL(9) via the first switch circuits 141 since the corresponding defective cell designation signals SEL(1) to SEL(9) are in the HIGH level.

On the contrary, since the defective cell designation signal SEL(10) is in the LOW level, the first switch circuit 141 of the tenth switch pair is turned OFF while the second switch circuit 143 of the tenth switch pair is turned ON. As a result, the tenth decode signal PX(10) is output to the eleventh word line WL(11), while the tenth word line WL(10) is cut off from electrical connection with the row decoder 12.

The subsequent eleventh to thirty-second decode signals PX(11) to PX(32) are output via the corresponding second switch circuits 143 to the downstream adjacent word lines WL. That is, the word lines WL receiving the decode signals PX(11) to PX(32) are shifted to those having the one-incremented numeral subscripts. As a result, the thirty-second decode signal PX(32) is output to the spare word line WL(33).

Thus, the embodiment of the present invention has the following advantages. Assume that 32 word lines WL extend across the memory cell array as an example. In the conventional shift redundancy circuit, it is necessary to provide the same number of the fuse elements FS as that of the word lines WL. On the contrary, in the shift redundancy circuit in this embodiment, only ten fuse elements FS (defective cell designation circuits 210) are required to effect redundant remedy. The number of the fuse elements FS required is therefore less than one third of the number of the word lines WL. This reduces the layout area for the shift redundancy circuit and thus facilitates reduction in chip area.

Moreover, only the same number as that of the defective cell designation circuits 210 is required for the signal lines extending between the fuse circuit 21 and the ROM decoder 22. This allows reduction in wiring area and thus further facilitates reduction in chip area.

Furthermore, the DC voltage determined upon powering is used for the defective cell designation signals SEL(1) to SEL(32) that determine the correspondence between the decode signals PX(1) to PX(32) supplied from the row decoder 12 and the word lines WL(1) to WL(32). This allows high-speed redundancy determination for a defective cell.

In this embodiment, the fuse elements were used as the power supply cut-off elements. Alternatively, switch elements such as MOS transistors may be used.

The defective cell designation section 13 as the shift redundancy circuit was configured to receive the output signals from the row decoder 12. Alternatively, it may be configured to receive output signals from a column decoder (not shown) for selecting column lines. Otherwise, the defective cell designation section 13 may be provided for both the word lines and the column lines.

(First alteration of the embodiment)

The first alternation of the embodiment of the present invention will be described with reference to the relevant drawing.

Figure 9:
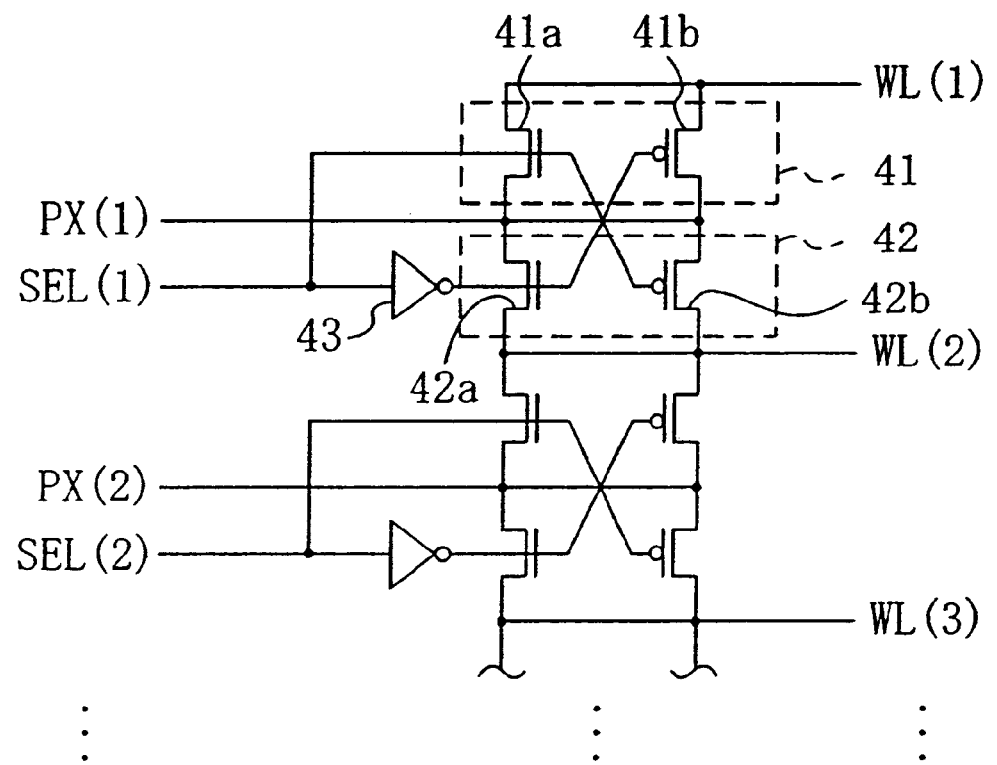
FIG. 9 is a circuit diagram of a first alteration of the selector circuit in the embodiment of the present invention.
Figure 9:
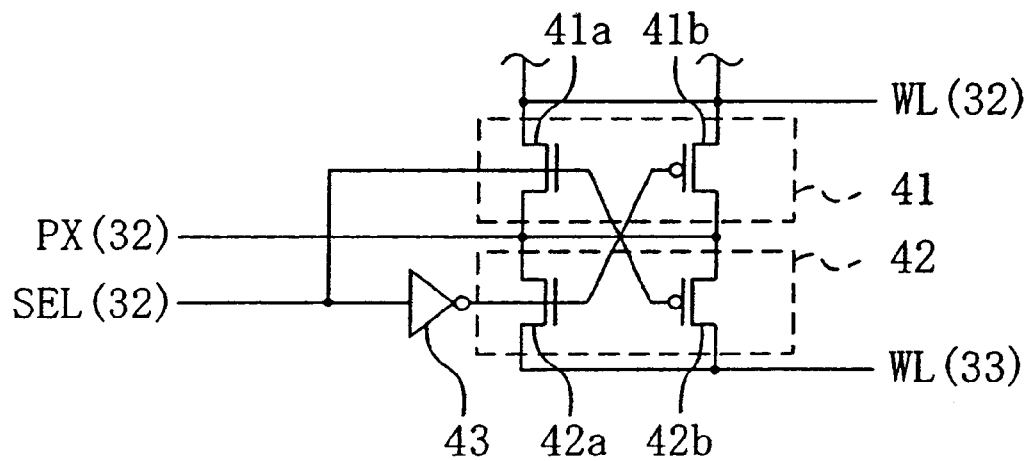

FIG. 9 shows a circuit configuration of a selector circuit 14A of the semiconductor memory device in the first alteration. In FIG. 9, the first switch pair for the first decode signal PX(1) out of the 32 decode signals PX(1) to PX(32) supplied from the row decoder 12 will be described as an example. The switch pair includes: a first switch circuit 41 essentially composed of an NMOS transistor 41a and a PMOS transistor 41b arranged in parallel between the first decode signal PX(1) and the first word line WL(1); and a second switch circuit 42 essentially composed of an NMOS transistor 42a and a PMOS transistor 42b arranged in parallel between the first decode signal PX(1) and the second word line WL(2). Therefore, in order to allocate 32 decode signals PX to 33 word lines WL, it is necessary to provide 32 first switch circuits 41 and 32 second switch circuits 42.

In the first switch circuit 41, the defective cell designation signal SEL is applied to the gate of the NMOS transistor 41a, and a signal inverted from the defective cell designation signal SEL by an inverter 43 is applied to the gate of the PMOS transistor 41b.

In the second switch circuit 42, the signal inverted from the defective cell designation signal SEL by the inverter 43 is applied to the gate of the NMOS transistor 42a, and the defective cell designation signal SEL is applied to the gate of the PMOS transistor 42b.

With the above configuration, when the first defective cell designation signal SEL(1) is in the HIGH level, for example, both the NMOS transistor 41a and the PMOS transistor 41b of the first switch circuit 41 are in the ON state, while both the NMOS transistor 42a and the PMOS transistor 42b of the second switch circuit 42 are in the OFF state. The first decode signal PX(1) is therefore output to the first word line WL(1).

On the contrary, when the first defective cell designation signal SEL(1) is in the LOW level, both the NMOS transistor 41a and the PMOS transistor 41b of the first switch circuit 41 are in the OFF state, while both the NMOS transistor 42a and the PMOS transistor 42b of the second switch circuit 42 are in the ON state. The first decode signal PX(1) is therefore electrically disconnected from the first word line WL(1) and output to the second word line WL(2).

In this alteration, each of the first switch circuit 41 and the second switch circuit 42 is essentially composed of only two transistors. The circuit size is therefore reduced compared with the switch circuit 141 shown in FIG. 3 that is essentially composed of four transistors including the inverter 14c. Thus, the layout area of the redundancy circuit is further reduced.

(Second alteration of the embodiment)

The second alternation of the embodiment of the present invention will be described with reference to the relevant drawing.

Figure 10:
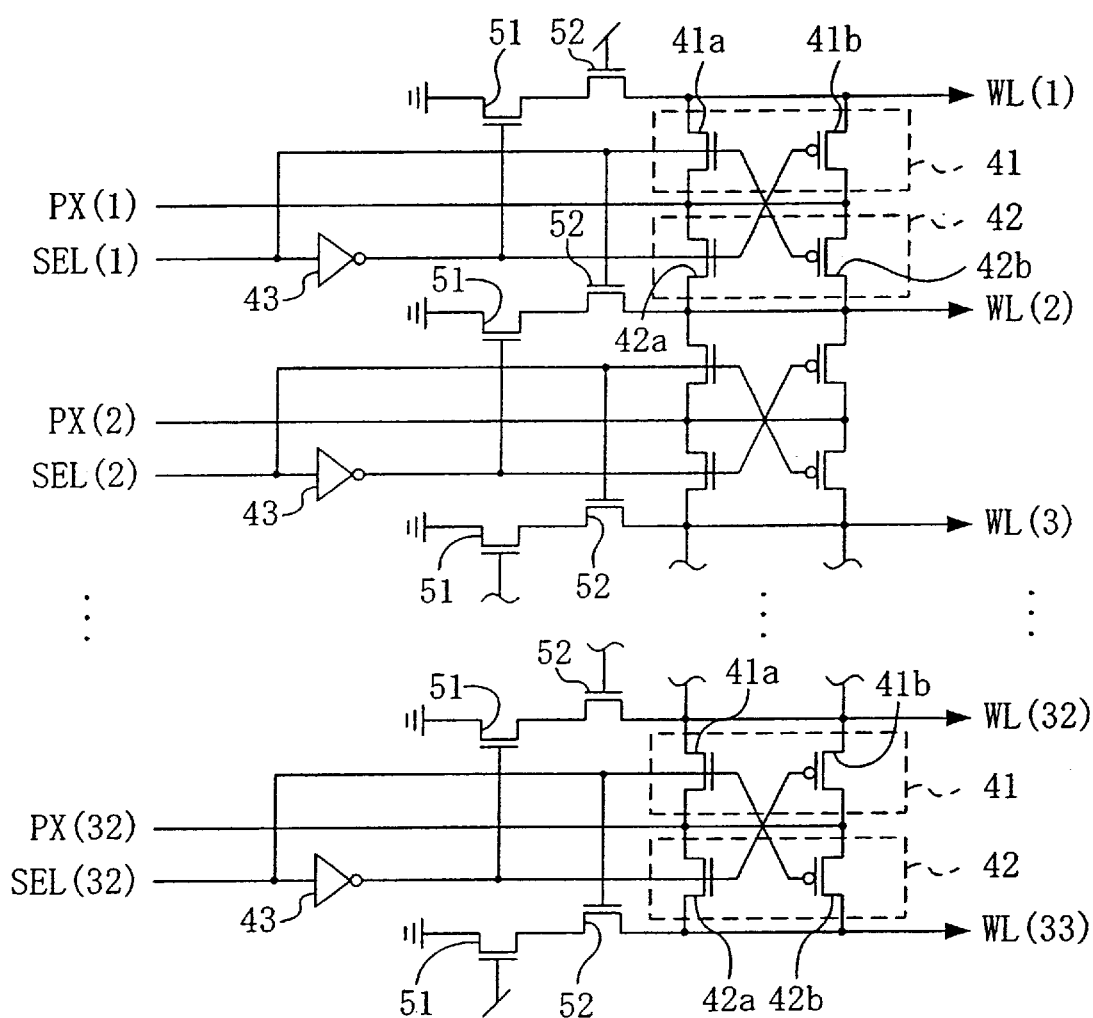
FIG. 10 is a circuit diagram of a second alteration of the selector circuit in the embodiment of the present invention.
Figure 11:
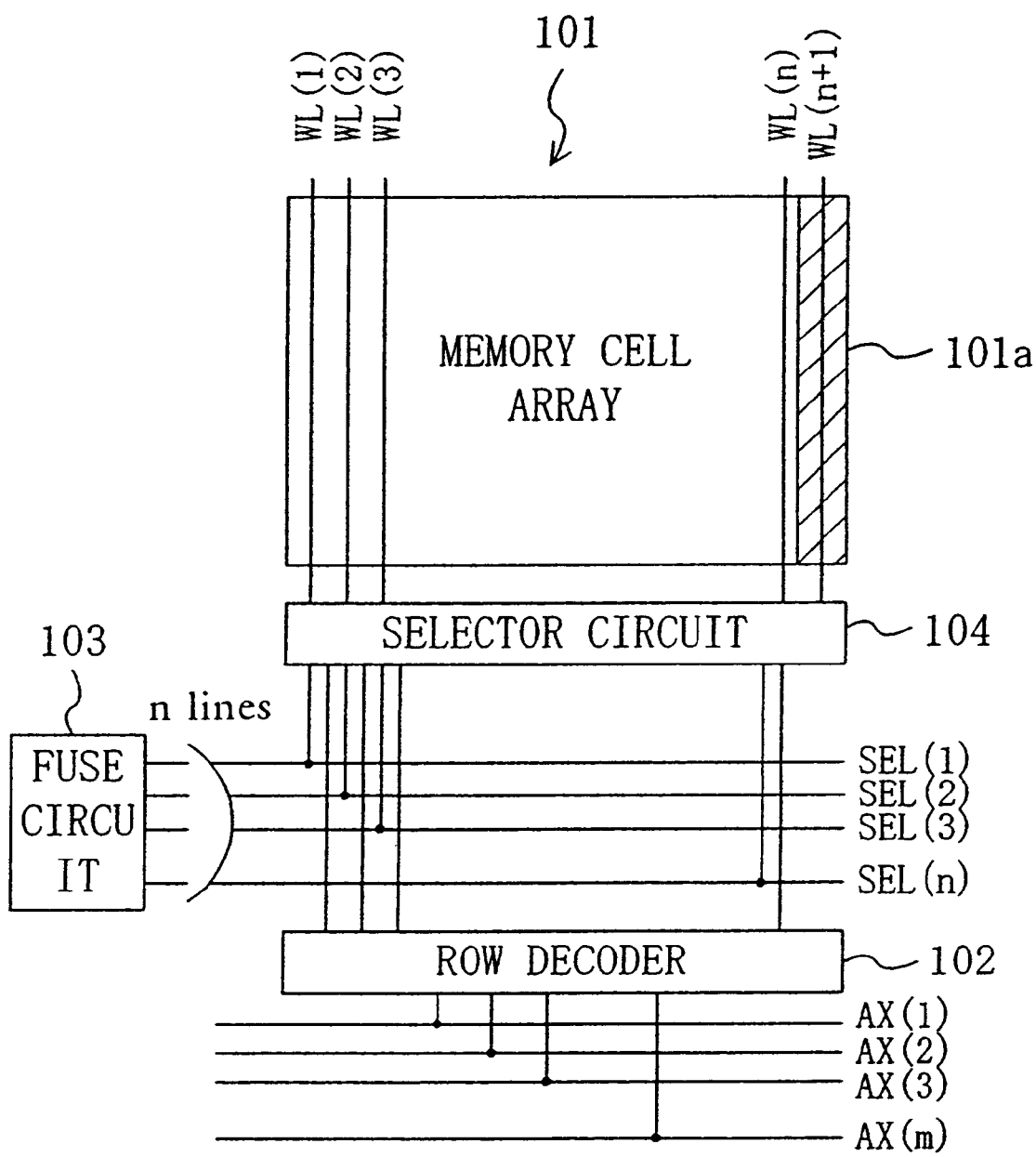
FIG. 11 is a schematic diagram of the construction of a conventional semiconductor memory device provided with a shift redundancy circuit.

FIG. 10 shows a circuit configuration of a selector circuit 14B of the semiconductor memory device in the second alteration. In FIG. 10, the same components as those shown in FIG. 9 are denoted by the same reference numerals, and the description thereof is omitted here.

Referring to FIG. 10, in the selector circuit 14B of this alteration, the terminals of the word lines WL(n; n=1 to 32) located opposite to the memory cell array are grounded. Between the ground terminal and the second switch circuit 42, arranged in series are: a first NMOS transistor 51 as a ground circuit located closer to the ground terminal, the gate of which receives the inverted signal of the n-th defective cell designation signal SEL(n); and a second NMOS transistor 52 the gate of which receives the (n−1)th defective cell designation signal SEL(n−1) (n is an integer equal to or more than 2). Note that the gate of the second NMOS transistor 52 for the first word line WL(1) receives the power supply voltage.

The spare word line WL(33) is also grounded and has the first NMOS transistor 51 the gate of which receives the power supply voltage and the second NMOS transistor 52 the gate of which receives the thirty-second defective cell designation signal SEL(32), connected in series.

In the selector circuit 14B with the above configuration, assume first the case where no defective cell is detected in the memory cell array. All the defective cell designation signals SEL are in the HIGH level, and thus all the decode signals PX(1) to PX(32) are output to the corresponding first to thirty-second word lines WL(1) to WL(32). At this time, since the LOW potential is applied to the gates of the first NMOS transistors 51, the respective word lines WL are allowed to be cut off from the ground potential.

As for the spare word line WL(33) to which no decode signal PX is applied, both the first NMOS transistor 51 and the second NMOS transistor 52 are in the ON state and grounded.

Next the case where a defective cell has been detected will be described. Assuming that a memory cell connected to the tenth word line WL(10) is defective, the tenth to thirty-second defective cell designation signal SEL(10) to SEL(32) are turned to the LOW level. As a result, the first switch circuits 41 corresponding to the tenth decode signal PX(10) as well as the subsequent eleventh to thirty-second decode signals PX(11) to PX(32) are turned OFF, while the corresponding second switch circuits 42 are turned ON. Thus, the tenth to thirty-second decode signals PX(10) to PX(32) are output to the word lines WL shifted by one line toward the spare word line WEL(33).

The tenth word line WL(10) is electrically disconnected from the tenth decode signal PX(10). In addition, the inverted signal of the LOW-potential defective cell designation signal SEL(10) is applied to the gate of the first NMOS transistor 51, and the HIGH-potential defective cell designation signal SEL(9) is applied to the gate of the second NMOS transistor 52. This turns ON both the first and second NMOS transistors 51 and 52, thereby turning the tenth word line WL(10) to the ground potential.

Thus, in the second alteration, an unused word line or the spare word line to which the decode signal PX is not supplied is positively turned to the ground potential in the shift redundancy circuit scheme using a spare word line. This serves to prevent circuit malfunction from occurring due to an unstable potential state of the word line.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all alterations of the invention that fall within the true spirit and scope of the invention.

What is claimed is:

1. A semiconductor memory device formed on a semiconductor substrate, comprising:

a memory cell array including a plurality of memory cell groups arranged in a plurality of rows or columns, each of the memory cell groups having a plurality of memory cells lined in a row or column, and a redundant cell group having a plurality of redundant cells arranged in parallel with the memory cell groups;

a plurality of cell selection lines for selecting a specific memory cell group out of the plurality of memory cell groups;

a redundant cell selection line for selecting the redundant cell group;

a cell selection circuit for outputting decode signals and allowing one cell selection line out of the plurality of cell selection lines to select the specific memory cell group based on an external signal;

defective cell designation means for outputting defective cell designation signals designating a pre-detected defective cell out of the plurality of memory cells; and connection change means for electrically disconnecting the cell selection line selecting the memory cell group including the defective cell from the cell selection circuit and outputting an output signal from the cell selection circuit to the redundant cell group, the connection change means shifting connection between each of the decode signals and associated one of either the plurality of cell selection lines or the redundant cell selection line in response to an associated one of the defective cell designation signals;

wherein the defective cell designation means comprises:
a plurality of defective cell designation circuits for outputting encoded designation signals capable of designating the plurality of cell selection lines; and
a defective cell designation signal generation circuit for decoding the encoded designation signals and generating the defective cell designation signals.

2. The device of claim 1, wherein the defective cell designation signal generation circuit comprises:

a decode circuit for receiving the encoded designation signals, decoding the encoded designation signals to a plurality of decoded signals respectively corresponding to the plurality of cell selection lines, and outputting the plurality of decoded signals;

a connection change control circuit for receiving the plurality of decoded signals, generating the defective cell designation signals for allowing the plurality of cell selection lines excluding the cell selection line selecting the memory cell group including the defective cell and the redundant cell selection line to correspond with the output signals from the cell selection circuit, and outputting the defective cell designation signals.

3. The device of claim 2, wherein the redundant cells and the redundant cell selection line are placed on a side end of the memory cell array, the connection change means receives the defective cell designation signals and outputs the output signals from the cell selection circuit to the cell selection lines by sequentially shifting by one line from the cell selection line selecting the memory cell group including the defective cell downstream toward the redundant cell selection line.

4. The device of claim 3, wherein the connection change means comprises:

a ground circuit that turns the potential of the redundant cell selection line to the ground potential when no defective cell is detected in the plurality of memory cells or, when a defective cell has been detected, turns the potential of the cell selection line selecting the memory cell group including the defective cell to the ground potential.

5. The device of claim 2, wherein each of the plurality of defective cell designation circuits comprises:

a power supply cut-off element capable of cutting off supply of the power supply voltage that drives the defective cell designation circuit; and a signal latch circuit connected to the power supply cut-off element for latching a signal with the same phase as an input signal and outputting the signal.

6. The device of claim 5, wherein the power supply cut-off element is a fuse element.

7. The device of claim 2, wherein the connection change control circuit includes a plurality of unit circuits that receive the plurality of decoded signals, and the unit circuits are connected with each other so that an output signal from each of the unit circuits also serves as one input signal to the adjacent unit circuit downstream toward the signal line corresponding to the redundant cell selection line.

8. The device of claim 1, wherein each of said plurality of defective cell designation circuits comprises a fuse element utilized in the generation of said encoded designation signals, and a total number of fuse elements utilized in said defective cell designation means is less than a total number of cell selection lines.

9. The device of claim 1, wherein upon identification of a defective cell, said change connection means functions to shift the connection of a first decode signal originally designated to be connected to the cell selection line corresponding to the defective cell to an adjacent cell selection line, and to shift the connection of each decode line subsequent to said first decode signal to an adjacent cell selection line.

10. The device of claim 1, wherein said change connection means comprises a plurality of switch elements, said change connection means operable for coupling each of said decode signals to either a first cell selection line or a selection line adjacent said first cell selection line.

* * * * *